(12) United States Patent
Morita et al.

(10) Patent No.: US 7,590,929 B2
(45) Date of Patent: Sep. 15, 2009

(54) RECORD REPRODUCTION METHOD, APPARATUS, AND CIRCUIT FOR USING ERROR CORRECTING CODE

(75) Inventors: Toshihiko Morita, Kawasaki (JP); Mitsuhiko Ohta, Kanagawa (JP); Takao Sugawara, Isehara (JP)

(73) Assignee: Fujitsu Limited, Kawasaki (JP)

(*) Notice: Subject to any disclaimer, the term of this patent is extended or adjusted under 35 U.S.C. 154(b) by 129 days.

(21) Appl. No.: 10/869,585

(22) Filed: Jun. 16, 2004

(65) Prior Publication Data

US 2005/0066261 A1 Mar. 24, 2005

(30) Foreign Application Priority Data

Sep. 19, 2003 (JP) ............................. 2003-329071

(51) Int. Cl.
*H03M 13/00* (2006.01)

(52) U.S. Cl. .................. 714/800; 714/755; 714/758; 714/794; 714/795; 341/59

(58) Field of Classification Search .................. 714/755, 714/794, 795, 801, 800; 360/53; 341/59
See application file for complete search history.

(56) References Cited

U.S. PATENT DOCUMENTS

| 5,446,747 | A | 8/1995 | Berrou | |
|---|---|---|---|---|
| 6,526,530 | B1 * | 2/2003 | Nazari et al. ................. | 714/701 |
| 6,643,814 | B1 * | 11/2003 | Cideciyan et al. ............ | 714/755 |
| 6,757,122 | B1 * | 6/2004 | Kuznetsov et al. ............ | 360/53 |
| 2002/0014980 | A1 * | 2/2002 | Rub et al. ...................... | 341/59 |
| 2002/0188906 | A1 * | 12/2002 | Kurtas et al. ................. | 714/755 |
| 2004/0093554 | A1 * | 5/2004 | Hung .......................... | 714/801 |

FOREIGN PATENT DOCUMENTS

| JP | A 11-55668 | 2/1999 |
|---|---|---|
| JP | 2002-076921 | 3/2002 |
| JP | 2003-068024 | 3/2003 |
| JP | 2003-223764 | 8/2003 |

OTHER PUBLICATIONS

"Application of Low Density Parity Check Code and Iterative Decoding to Magnetic Recording System", Atsushi Esumi et al., Technical Report of IEICE. MR2002-62 (2002).

* cited by examiner

*Primary Examiner*—Guy J Lamarre
*Assistant Examiner*—Sam Rizk
(74) *Attorney, Agent, or Firm*—Greer, Burns & Crain, Ltd.

(57) ABSTRACT

A record reproduction apparatus includes an encoding unit that encodes sector data to be written into a recording medium, by dividing the data into a predetermined number of blocks, and an iterative decoding unit that iteratively decodes the sector data read from the recording medium, by dividing the sector data into the predetermined number of blocks.

11 Claims, 8 Drawing Sheets

| NUMBER OF DIVISION | SN@SER=-4 | SN GAIN@SER=-4 |
|---|---|---|
| 1 | 20.87 | 0 |
| 2 | 20.78 | 0.09 |
| 4 | 20.72 | 0.15 |
| 8 | 20.71 | 0.16 |
| 16 | 20.73 | 0.14 |
| 32 | 20.8 | 0.07 |
| 64 | 20.93 | -0.06 |
| 128 | 21.17 | -0.3 |

BACKGROUND ART

RECORD REPRODUCTION METHOD, APPARATUS, AND CIRCUIT FOR USING ERROR CORRECTING CODE

BACKGROUND OF THE INVENTION

1) Field of the Invention

The present invention relates to a technology for performing error correction when reproducing recorded data.

2) Description of the Related Art

Record reproduction apparatuses have a powerful error correcting function so that a signal can be reproduced without generation of an error. Only with such an error correcting function does it become possible to securely restore a signal from among unstable signals having noise.

The error correcting function is realized by a combination of two methods: a partial response maximum likelihood (PRML) and an error correcting code (ECC). The PRML is a system that regards a recording channel as a partial response (PR) channel having an inter-symbol interference, and generally carries out a maximum likelihood detection using a Viterbi detector. The ECC corrects an error that cannot be corrected by the Viterbi detector, and generally uses Reed-Solomon (RS) codes (for example, refer to S. Lin and D. J. Costello, Jr., "Error control coding: fundamentals and applications," Prentice-Hall, 1983).

An iterative method (U.S. Pat. No. 5,446,747), which employs iterative decoding, has been proposed as a replacement of the PRML system.

As detailed configurations of iterative methods that can be applied to the record reproduction apparatus, there are a serial concatenated convolutional code (SCCC) and a low density parity check (LDPC) code (refer to T. Souvignier et al., "Turbo Decoding for PR4: Parallel Versus Serial Concatenation," Proc. IEEE Int. Conf. on Communications, pp. 1638-1642, 1999, and R. G. Gallager, "Low-Density Parity-Check Codes," Cambridge, Ma: MIT Press, 1963). Particularly, the latter LDPC code is considered promising as a next-generation encoding method in a magnetic disk.

This LDPC code is a linear block code and can be defined in a parity check matrix H. When a codeword length is expressed as "N", an information bit length is expressed as "K", and a parity length is expressed as "M=N−K", H is a matrix of M rows and N columns. When a codeword sequence is expressed as $x=(x_1, x_2, \ldots, \text{and } x_N)$, and an information bit sequence is expressed as $u=(u_1, u_2, \ldots \text{and } u_k)$ in a row vector format, the following expression is formulated.

$$Hx^T = 0 \quad (1)$$

A matrix that encodes the information bit sequence u into the codeword x is called a generator matrix G, with which the following expression is formulated.

$$x = uG \quad (2)$$

Each row of H corresponds to one parity check equation. For example, $$H_1 = \begin{bmatrix} 1 & 1 & 0 & 1 & 0 & 0 \\ 0 & 1 & 0 & 0 & 1 & 1 \\ 1 & 0 & 1 & 0 & 0 & 1 \\ 0 & 0 & 1 & 1 & 1 & 0 \end{bmatrix} \quad (3)$$

corresponds to the four parity check equations:

$$x_1 + x_2 + x_4 = 0$$
$$x_2 + x_5 + x_6 = 0$$
$$x_1 + x_3 + x_6 = 0$$
$$x_3 + x_4 + x_5 = 0 \quad (4)$$

In the LDPC code, the code length N is set large, and the number of 1 within the parity check matrix H is set small (low density). Matrix H is constructed at random as far as possible, while a column weight (number of 1 in each column of H) is set small (typically three) and constant, and a row weight (number of 1 in each row of H) is also set constant. Based on this, when the block length (that is, the code length) is large, a high error correction capability can be realized.

Figure 10:
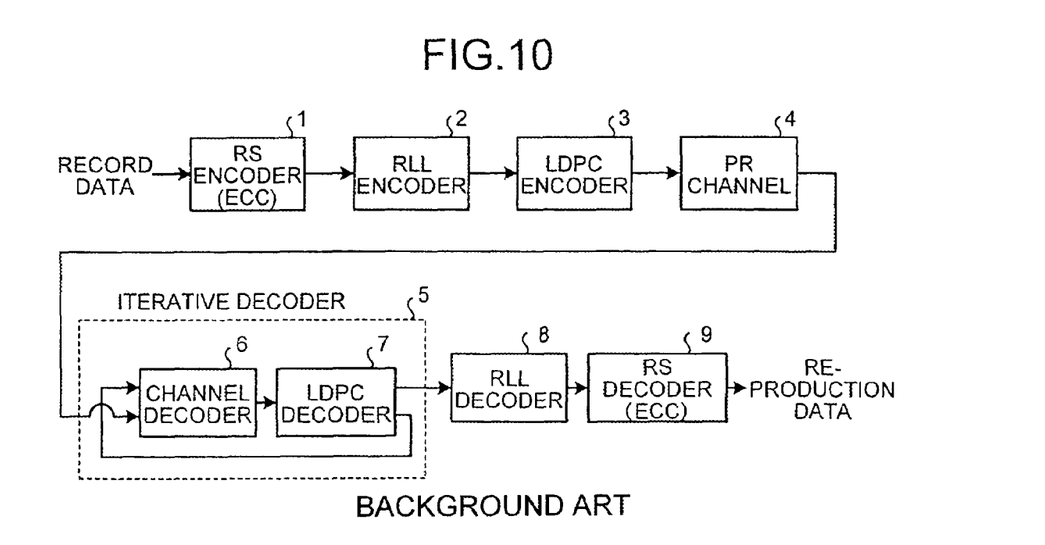
FIG. 10 is a functional block diagram of a conventional iterative magnetic disk apparatus.

FIG. 10 illustrates a basic configuration of the record and reproduction system for a magnetic disk apparatus that uses the LDPC code. The magnetic disk apparatus includes an RS encoder (ECC) 1 that encodes record data. Next, a run length limited (RLL) encoder 2 codes an output of the RS encoder 1 to constrain the continuation of 0 to not larger than a constant length. As a result of the RLL coding, the operation of an automatic gain controller (AGC) circuit or a timing recovery circuit at the time of reproducing the record data can be stabilized. Next, an LDPC encoder 3 performs LDPC coding to an output of the RLL encoder 2 using the equation (2) to obtain a data sequence. The data sequence thus obtained is recorded onto a PR channel 4.

Reproduction data is first input to an iterative decoder 5 that includes a channel decoder 6 and an LDPC decoder 7. The channel decoder 6 calculates reliability information of each bit while taking into account the inter-symbol interference of the PR channel, and sends the obtained reliability information to the LDPC decoder 7. The LDPC decoder 7 updates the reliability information of each bit by taking into account the information obtained from the channel decoder 6 and a constraint according to the parity check equations. The result is sent to the channel decoder 6 again thereby forming a loop. After iterating a decoding by a predetermined number of times, the reliability information obtained by the LDPC decoder 7 is processed based on a threshold value thereby obtaining a reproduction value of each bit. This reproduction value is sent to an RS decoder 9 via an RLL decoder 8, and is error-corrected based on the RS code. Then, final reproduction data is obtained.

As a concrete decoding procedure of the channel decoder 6, a BCJR algorithm is available (L. R. Bahl et al., "Optimal decoding of linear codes for minimizing symbol error rate," IEEE Trans. Inform. Theory, vol. 20, pp. 248-87, 1974). As a concrete decoding procedure of the LDPC decoder 7, a belief propagation algorithm is available (Z. Wu, "Coding and iterative detection for magnetic recording channels," Kluwer Academic Publishers, 2000).

Although the iterative method is more reliable than the PRML method, circuit scale of the encoder and the decoder is still a major challenge for achieving a practical large-scale integrated circuit (LSI) with low power consumption.

The increase in the circuit scale is due to an increase in the amount of decoding operation that is necessary to carry out the iterative decoding. For example, when the decoding is carried out four times in iteration, in order to keep the same operation time as that required conventionally, four circuits need to be arranged in parallel and operated in pipeline. Consequently, the circuit scale and the power consumption become four times. To cope with this situation, a soft output Viterbi Algorithm (SOVA) and a decision aided equalizer (DAE) method are proposed to reduce the decoding operation amount.

The increase in the circuit scale is also due to an increase in the size of the memory that is necessary to hold the reliability information for all bits during the iterative decoding.

Precisely, the current magnetic disk apparatus records and reproduces 512 bytes as one unit (one sector). In this case, the code length of the LDPC code becomes about 600 bytes. When the reliability information of five bits is held for each bit, the necessary amount of memory becomes as large as about 3000 bytes. Recently there is a plan to expand one sector to 4 K bytes. In this case, the code length of the LDPC code increases to about 4700 bytes, and the memory amount increases to about 23500 bytes, which is too large to be implemented.

SUMMARY OF THE INVENTION

It is an object of the present invention to reduce the circuit size of the iterative decoder.

A record reproduction apparatus according to one aspect of the present invention uses an error correcting code and an iterative method, and includes an encoding unit that encodes sector data to be written into a recording medium, by dividing the data into a predetermined number of blocks; and an iterative decoding unit that iteratively decodes the sector data read from the recording medium, by dividing the sector data into the predetermined number of blocks.

A record reproduction method according to another aspect of the present invention uses an error correcting code and an iterative method, and includes encoding sector data to be written into a recording medium, by dividing the data into a predetermined number of blocks; and iteratively decoding the sector data read from the recording medium, by dividing the sector data into the predetermined number of blocks.

A record reproduction circuit according to still another aspect of the present invention that uses an error correcting code and an iterative method, and includes an encoding unit that encodes sector data to be written into a recording medium, by dividing the data into a predetermined number of blocks; and an iterative decoding unit that iteratively decodes the sector data read from the recording medium, by dividing the sector data into the predetermined number of blocks.

The other objects, features, and advantages of the present invention are specifically set forth in or will become apparent from the following detailed descriptions of the invention when read in conjunction with the accompanying drawings.

DETAILED DESCRIPTION

Exemplary embodiments of a magnetic disk apparatus as a representative of a record reproduction apparatus, and a method and a circuit for record reproduction will be explained below with reference to the accompanying drawings.

Figure 1:
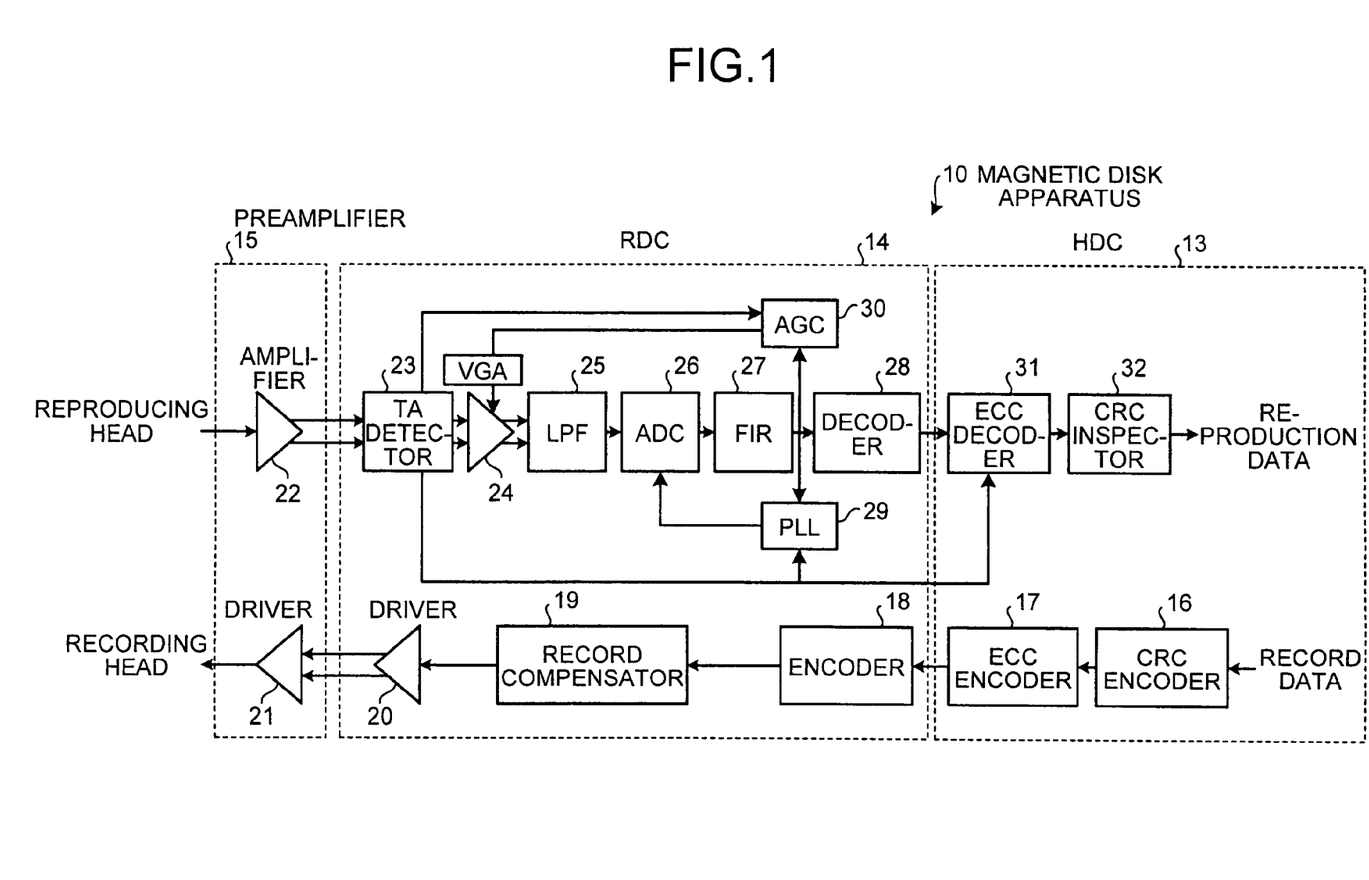
FIG. 1 is a functional block diagram of a magnetic disk apparatus according to a first embodiment of the present invention.

FIG. 1 is a general block diagram of a magnetic disk apparatus. The record reproduction system of the magnetic disk apparatus 10 includes a hard disk controller (HDC) 13, a read channel (RDC) 14, and a preamplifier 15.

A cyclic redundancy check (CRC) encoder 16 and an ECC encoder 17 add parity to the record data within the HDC 13. A CRC code is used to detect an error of the ECC. The RDC 14 sends the record data to the preamplifier 15 via an encoder 18, a record compensator 19, and a driver 20. The encoder 18 executes an RLL encoding and a parity encoding. The record compensator 19 executes a compensation to slightly expand a transition interval at a portion where a magnetic transition is adjacent. The preamplifier 15 then makes a driver 21 generate a write current to a recording head.

At the reproduction time, the preamplifier 22 first amplifies the analog voltage from the read head, and sends the amplified voltage to the RDC 14. The RDC 14 executes a thermal asperity detection 23, and converts the signal into a digital signal via a variable gain amplifier (VGA) 24, a low pass filter (LPF) 25, and an AD converter (ADC) 26. An FIR filter 27 executes a waveform equalization, and a decoder 28 executes a signal detection and a decode processing corresponding to the encoder 18. A PLL 29 that controls the timing of sampling a signal, and an AGC 30 that controls the gain of the variable gain amplifier 24 are also installed within the RDC 14. A result of the decoding by the RDC 14 is returned to the HDC 13. An ECC decoder 31 corrects an error, and obtains reproduction data via a CRC inspector 32.

Figure 2A:
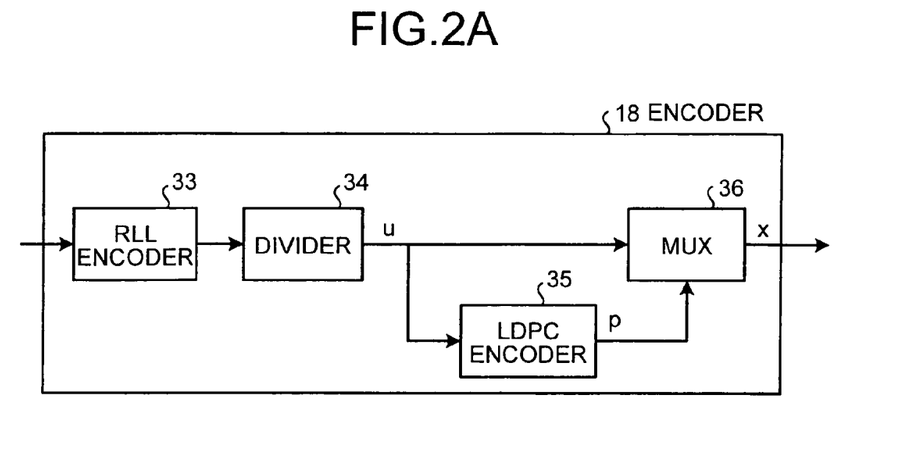
FIG. 2A is a functional block diagram of an encoder.
Figure 2B:
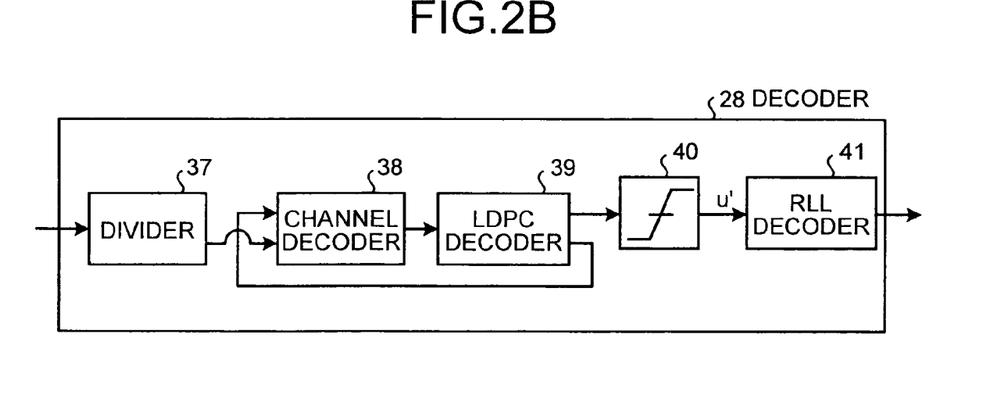
FIG. 2B is a functional block diagram of a decoder.

FIG. 2A is a functional block diagram of the encoder 18, and FIG. 2B is a functional block diagram of the decoder 28 based on the present invention. The encoder 18 and the decoder 28 here are based on LDPC codes.

The input data to the encoder 18 is first encoded by the RLL encoder 33. The divider 34 then divides the data sequence into block data of a predetermined length. The LDPC encoder 35 generates parity bits for this block data. A multiplexer (MUX) 36 inserts the parity into u at every constant period. A bit sequence x obtained as a result becomes an output from the encoder.

A channel decoder 38 and an LDPC decoder 39 are used to execute the decoding in iteration. A divider 37 is provided to divide the read data sequence into block data of a predetermined length, and input the data into the channel decoder 38. After the iterative decoding by a predetermined number of times, the reliability information that is output from the LDPC decoder 39 is sliced with a threshold value thereby obtaining a decision result u'. The decision result u' is output via an RLL decoder 41.

Figure 3:
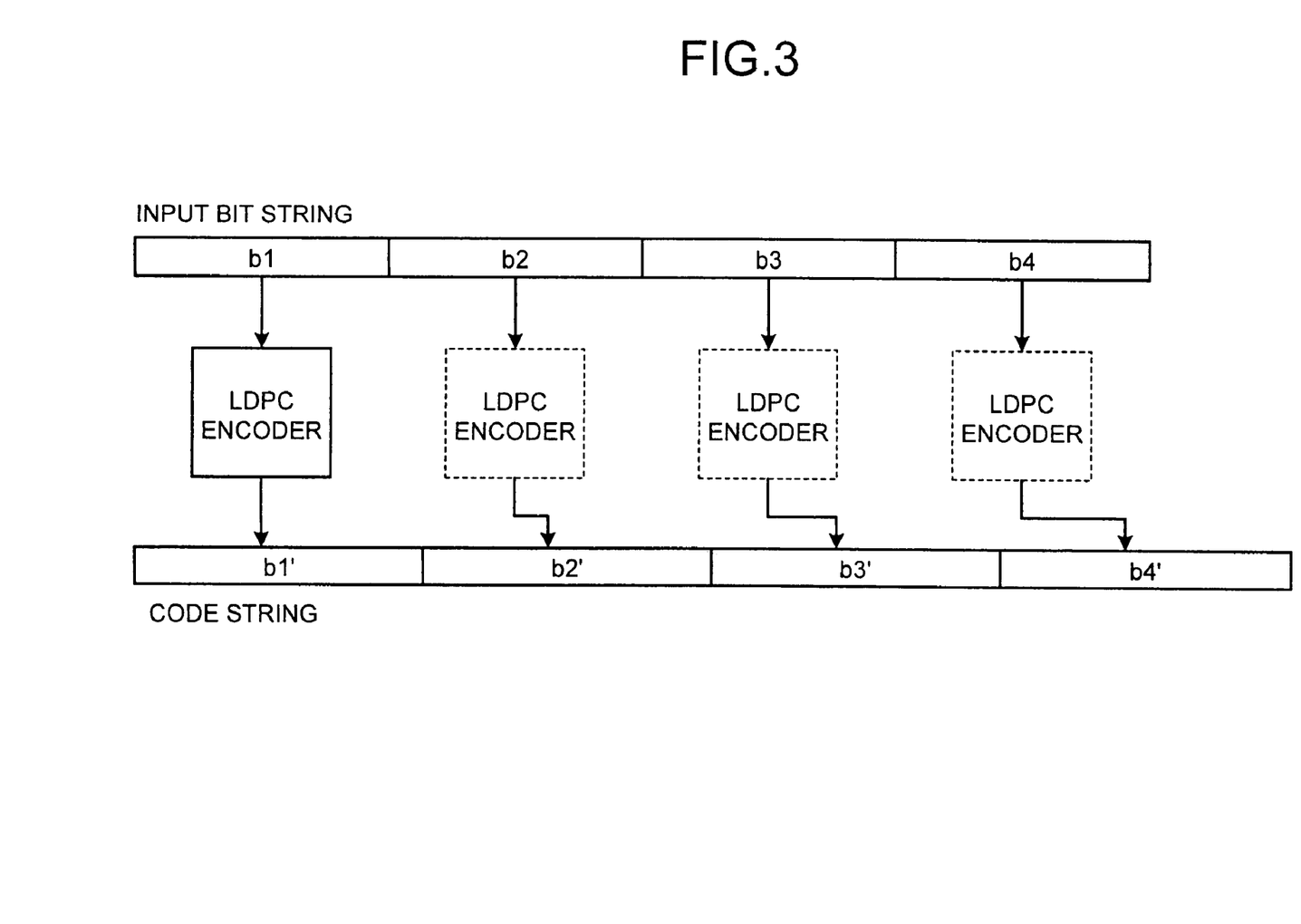
FIG. 3 is an explanatory diagram of the operation of the encoder.

The divider 34 divides one sector into a plurality of blocks, and sequentially provides them for the LDPC encoder 35. FIG. 3 illustrates these encoding steps more specifically, assuming that one sector is divided into four blocks, b1 to b4. Note that the input bit sequence shown in FIG. 3 is an output from the RLL encoder 33.

The LDPC encoder 35 first encodes the block b1, and outputs a codeword b1'. Next, the LDPC encoder 35 encodes the block b2, and outputs a codeword b2'. Similarly, the LDPC encoder 35 sequentially encodes the blocks b3 and b4. As illustrated in the drawing, the total output string becomes a sequence of b1' to b4'. At the decoding time, b1' to b4' are independently decoded, and b1 to b4 are sequentially output.

Based on the above configuration, the code length of the LDPC code can be made shorter. Consequently, the lesser memory is required to execute the encoding and the decoding. For example, in the case of the four division illustrated in FIG. 3, the memory amount can be decreased to one quarter.

Basically, the iterative system such as the LDPC code realizes a satisfactory performance by increasing the code length. When the code length is short, a bit error rate is degraded. Therefore, the above division of the sector is considered not preferable. However, this is the characteristic concerning the performance of the LDPC code itself, and the situation changes when the LDPC code is further combined with the ECC(RS code) as illustrated in FIG. 10. Actually, the code length of the LDPC code can be made shorter without degrading the performance when the number of division and the parity length of the ECC are selected properly.

Figure 4:
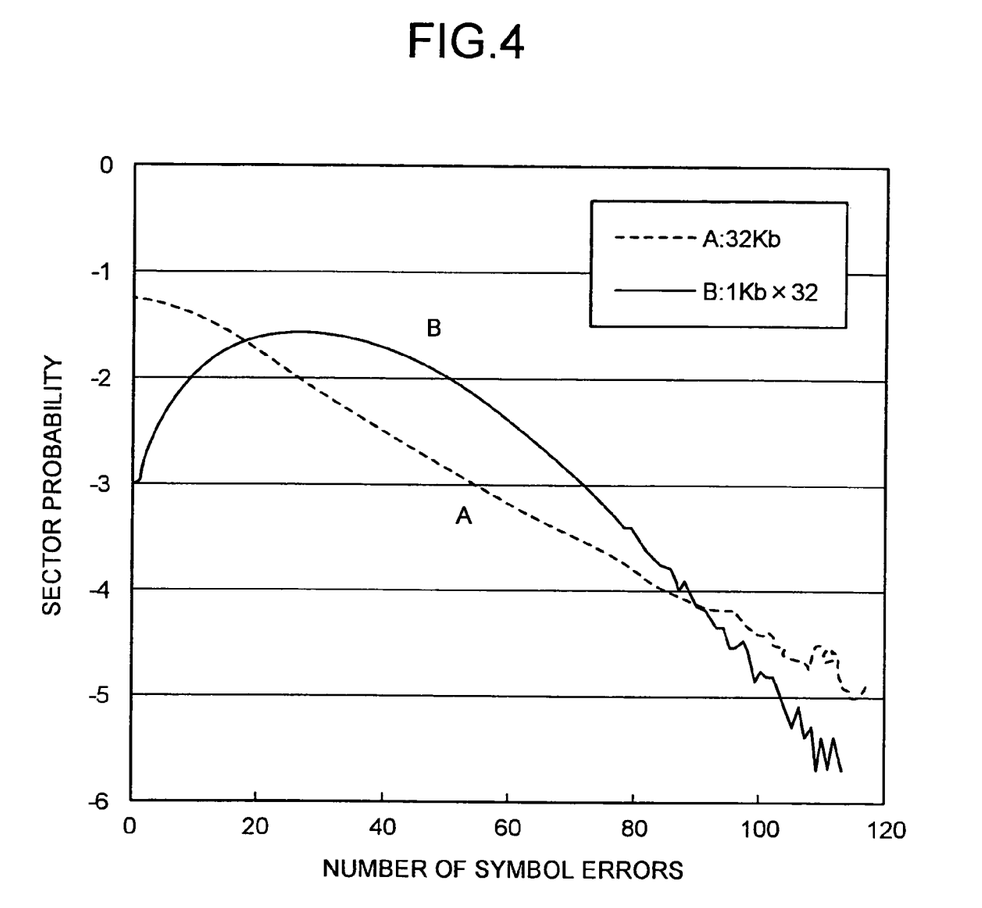
FIG. 4 is a graph of an error distribution.

FIG. 4 illustrates simulation results based on the configuration illustrated in FIG. 10. The plot shows the probability distribution of each number of symbol errors at a certain SNR (signal-to-noise ratio). Note that the sector length is 32 K bits (4 K bytes), and the symbol length is 12 bits. Plot A corresponds to LDPC codes with a block length of 32 K bits (4 K bytes), while plot B corresponds to LDPC codes with a block length of 1K bits. In other words, plot A expresses a result when the sector is not divided, while plot B expresses a result when the sector is divided into 32 blocks. Plot B shows that the probability of producing more than 80 symbol errors decreases by dividing the codes.

Figure 5:
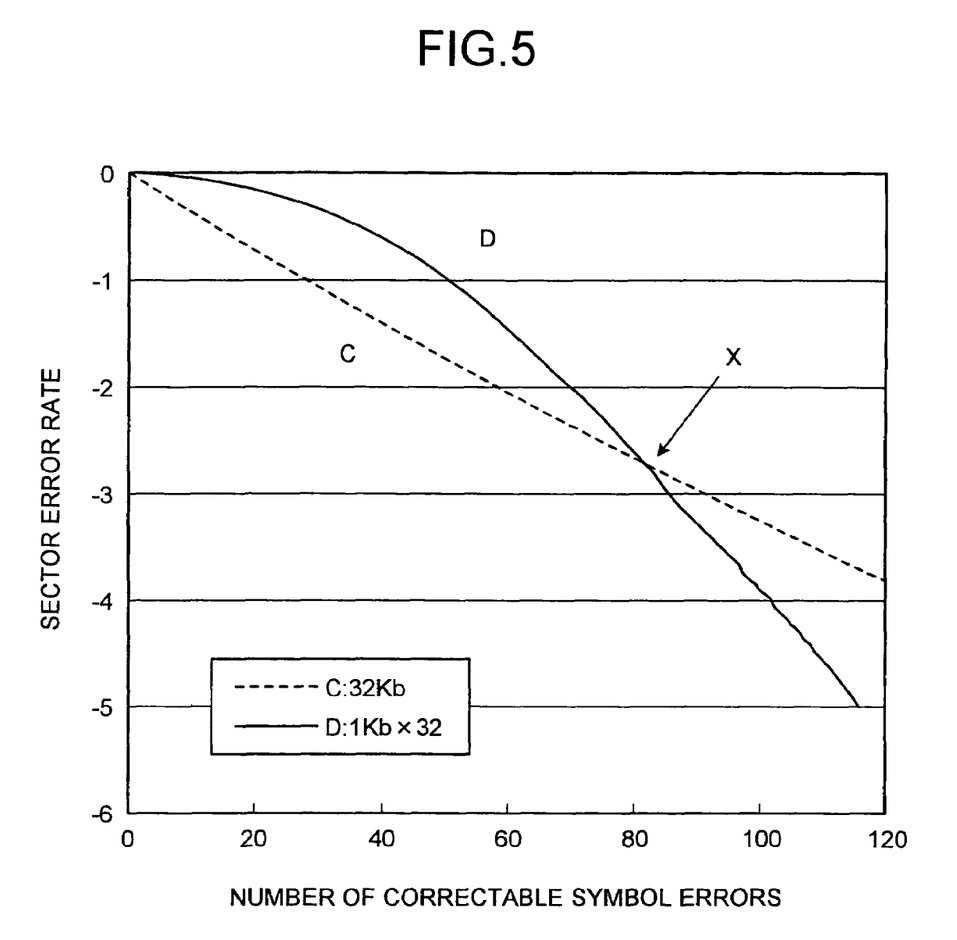
FIG. 5 illustrates a relation between an error correction performance and an ECC.

FIG. 5 illustrates a result of calculating a sector error rate after the ECC based on the plots of A and B. Plot C expresses a result when the sector is not divided, and D expresses a result when the sector is divided into 32 blocks. The abscissa represents the number of correctable symbol errors of the ECC. It is important to note here that these plots C and D cross at a point X. The performance is reversed after this point between the division case and the non-division case. This is attributable to a shift of the plot B to a lower side of the plot A at the right side in FIG. 4. In the present embodiment, when the correctable symbol length of the ECC is larger than that at the point X (about 80 symbols in this example), the degradation of the performance due to the division can be prevented.

Figure 6:
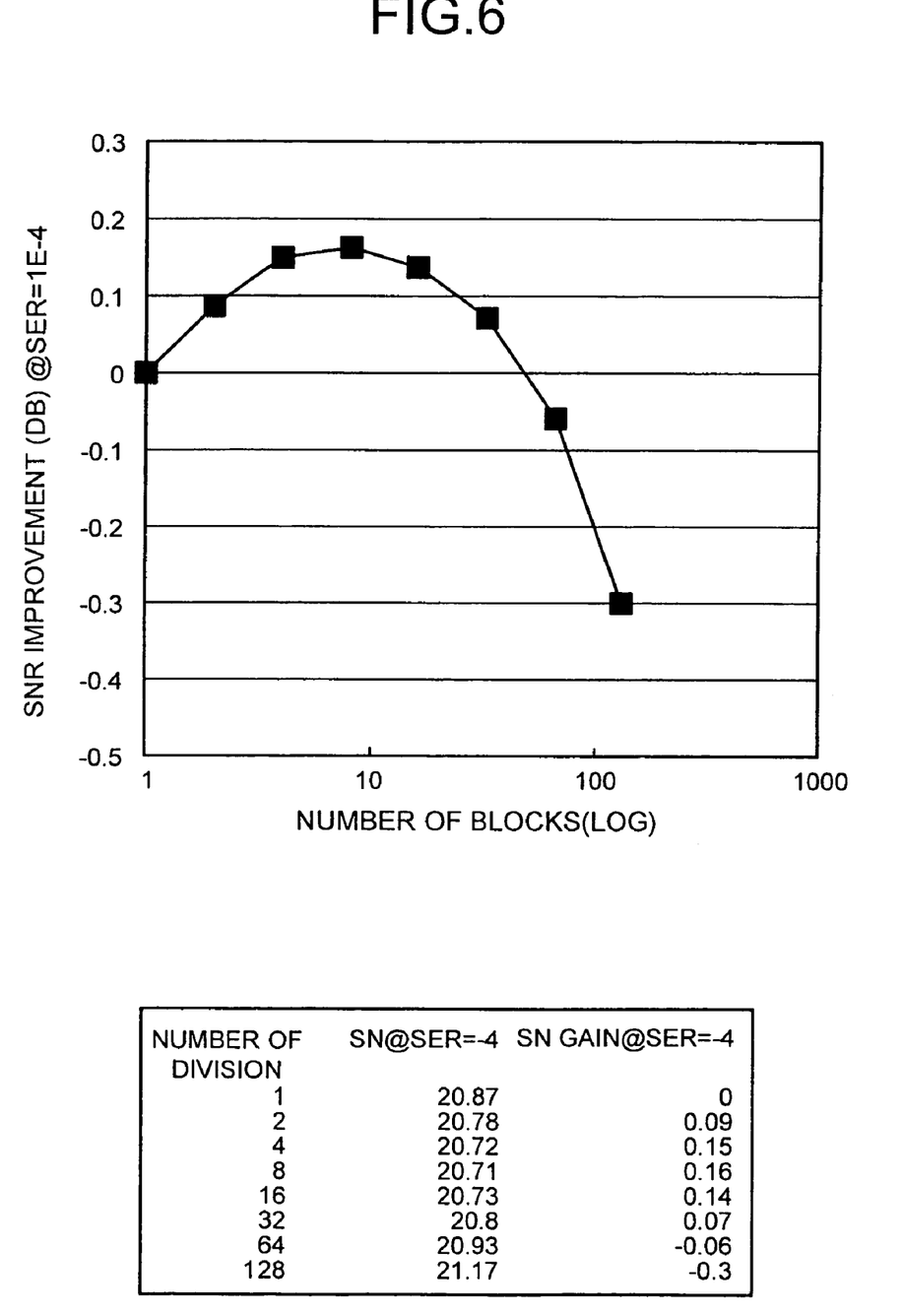
FIG. 6 illustrates a change in error correction performance according to number of divisions.

On the other hand, when the correctable symbol length of the ECC is fixed, in order to prevent the performance from being degraded, the number of division needs to be smaller than a certain value. FIG. 6 illustrates a result of simulation to obtain a change in the performance of LDPC codes after the ECC when the number of division increases. Note that the sector length is 32 K bits, and the symbol length is 12 bits. The number of symbol errors that the ECC can correct is set to 100 symbols. The vertical axis represents an SNR improvement obtained by dividing the sector. From FIG. 6, it is clear that when the number of division exceeds 64, the performance is degraded from that before the division, but the performance is not degraded when the number of division is equal to or smaller than 32, rather with a slight improvement in the performance.

Therefore, when the divided encoding and decoding are carried out by decreasing the code length of the LDPC code and when the number of division and the error correction capability of the ECC are selected properly, the circuit scale and the power consumption of the encoder and the decoder can be decreased without lowering the total error correction capability as described above. According to the encoder and the decoder in the first embodiment, one sector (4 K bytes) are divided into 32 blocks. The error correction capability of the ECC is set to 100 symbols (parity length of 200 symbols). With the above arrangement, the memory capacity can be set to one thirty-second, without degrading the performance.

Figure 8A:
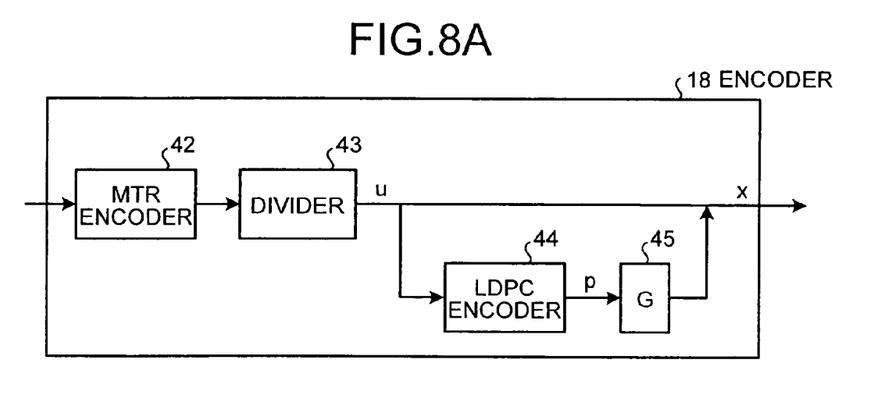
FIG. 8A is a functional block diagram of an encoder according to a second embodiment of the invention.
Figure 8B:
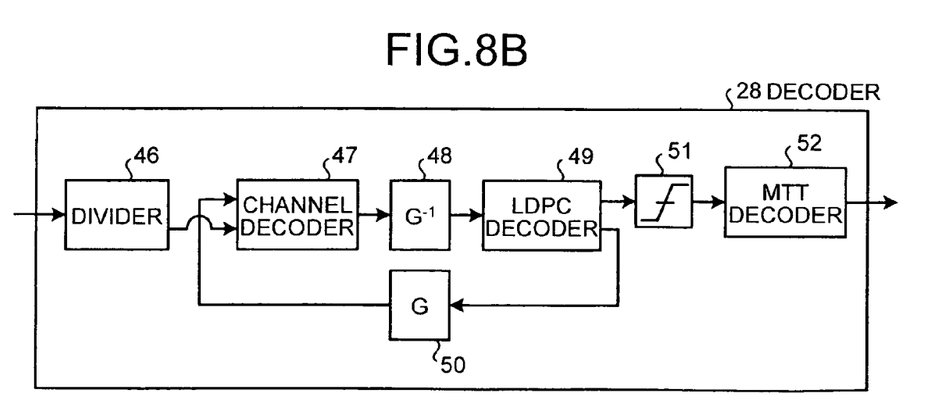
FIG. 8B is a functional block diagram of a decoder according to the second embodiment.

In a second embodiment according to the present invention, the encoder 18 is an LDPC encoder and has a configuration shown in FIG. 8A, the decoder 28 is an LDPC decoder and has a configuration shown in FIG. 8B. The second embodiment is different from the first embodiment in that the encoder 18 includes an MTR encoder 42 and the decoder 28 includes an MTR decoder 52. Functional concept of the second embodiment will be explained below; however, explanations identical to that of the first embodiment will be omitted.

An MTR code limits a continuation of 0 and a continuation of 1 at the same time. The MTR code that limits the continuation of 0 to k bits and limits the continuation of 1 to j bits is expressed as MTR (j; k). When j=2 or 3, a specific error event can be suppressed, and the error rate can be decreased. However, when parity is inserted at a constant interval using the MUX like at the time of the RLL code, the j constraint collapse at the insertion portion, and the suppression effect of the error event is lowered. Therefore, parity is collectively inserted at one position, and 0 is inserted at the j bit interval and 1 is inserted at the K bits interval such that the parity portion satisfies the MTR constraint. This is called "guard bit" (expressed as G in FIG. 8A and FIG. 8B). A configuration of inserting only 1 to satisfy the k constraint is also considered.

The decoding procedure in the second embodiment is similar to that in the first embodiment (where the RLL code is used). However, when a channel decoder 47 sends reliability information to an LDPC decoder 49, the guard bit portion is excluded (expressed as $G^{-1}$ in FIG. 8B). On the other hand, when the LDPC decoder 49 sends reliability information to the channel decoder 47, the reliability information of the guard bit is set to 0.

One sector is divided into 32 blocks in the second embodiment as well as in the first embodiment. Based on this, the memory capacity can be reduced to one thirty-second.

Figure 9A:
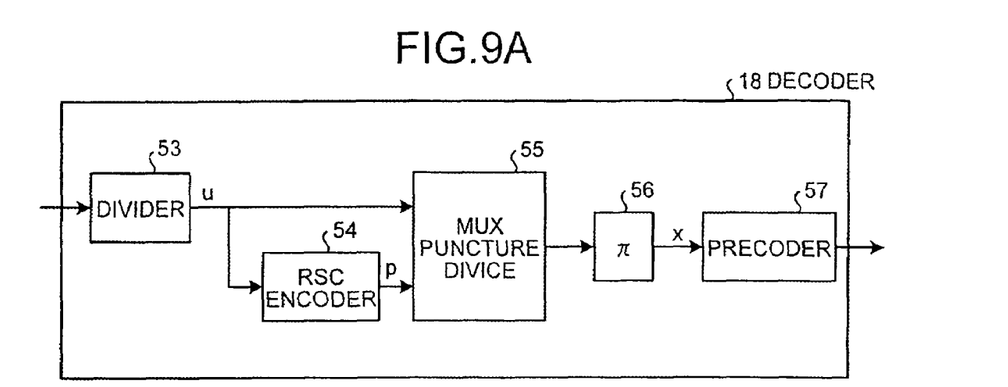
FIG. 9A is a functional block diagram of an encoder according to a third embodiment of the invention.
Figure 9B:
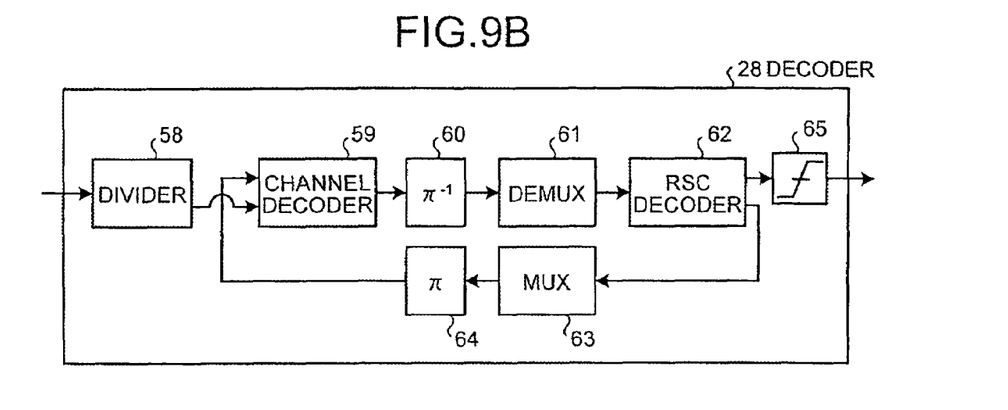
FIG. 9B is a functional block diagram of a decoder according to the third embodiment.

While the LDPC code is used in the first and the second embodiments, the present invention can also be applied to other iterative system. For example, FIG. 9A and FIG. 9B illustrate SCCC. First, a divider 53 converts the input data into block data of a predetermined length. Next, a MUX puncture device 55 inserts parity bits generated by a recursive systematic convolutional (RSC) encoder 54, into the block data. The result is sent as an output from the encoder after passing through a random interleaver 56 and a precoder 57. The length of the random interleaver 56 is set equal to the block length after the division. For example, when the sector of 4 K bytes is divided into 32, the length of the random interleaver is set to about 1 K bits.

In the decoder 28 shown in FIG. 9B, the divider 58 generates block data, and then a channel decoder 59 and an RSC decoder 62 execute the decoding in iteration. The channel decoder 59 or the RSC decoder 62 operates based on a BCJR method or a LogMAP method. The iterative decoding while delivering the reliability information between the two decoders is similar to that of the LDPC decode.

For the channel decoders 38 and 47 in the first and the second embodiments, the BCJR method or the LogMAP method as its Log expression can be used. In order to decrease the operation amount, a SOVA or a DAE method can also be used. A sum-product method or a min-sum method can be used for the LDPC decoders 39 and 49. The present invention can be applied regardless of a selection of a decoding algorithm.

For the "ECC" in the first and the second embodiments, a code other than the Reed-Solomon code can also be used. Further, both an interleave type and a non-interleave type can be used.

Figure 7:
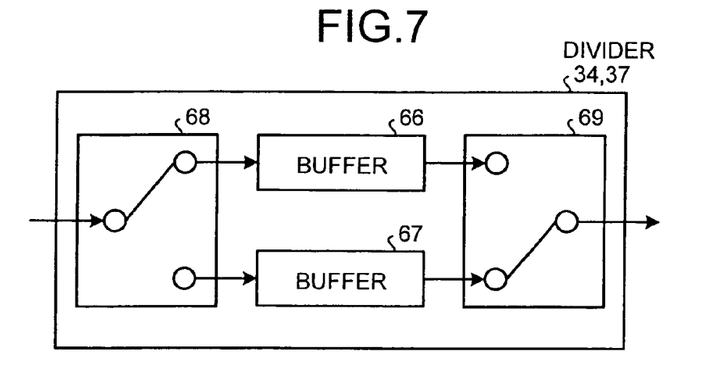
FIG. 7 is a functional block diagram of a divider.

A divider 34 (37) shown in FIG. 7 may be employed in the first and the second the embodiments. The divider 34 is based on a swing buffer method, and includes two data buffers 66 and 67 having the same length as the block length and two switches 68, 69. First, the switch 68 is switched towards the buffer 66 and the switch 69 is switched towards the buffer 67. When data is charged to the buffer 66, the switch 68 is switched towards the buffer 67, and the switch 69 is switched towards the buffer 1 (66). This is repeated alternately thereby enabling the continuously input data to be divided into block data of a predetermined length.

A technology that is similar to the one described here has been disclosed in "Application of low density parity check code and iterative decoding to magnetic recording system", Atsushi Esumi, Kazuhiro Nakaura, Tadashi Wadayama, Technical report of the Institute of Electronic, Information and Communication Engineers, MR2002-62 (2002-12). What is disclosed is a method for performing LDPC coding of shorter code length to bit-strings that have been subjected to block interleaving. However, in this method, because the interleaving and deinterleaving is required to be performed repeatedly when performing the decoding, a memory space that can accommodate the reliability information of all the bits becomes inevitable. On the contrary, in the method according to the present invention, because decoding is performed sequentially of the blocks that have been divided, there is not need to store the reliability information of all the bits, and therefore, the amount of memory can be reduced.

The whole or a part of the processing explained above may be executed automatically or manually. The whole or a part of the processing that is manually executed can also be executed automatically according to a known method. A processing procedure, a control procedure, detail names, and information including various data and parameters illustrated in the document and drawings can be optionally changed except where specified otherwise.

The constituent element of each device illustrated in the drawings illustrates a functional concept, and does not need to be physically configured as illustrated. In other words, a detailed mode of decentralization or integration of each device is not limited to the one as illustrated in the drawings. The whole or a part of the devices can be functionally configured or physically decentralized or integrated in an optional unit depending on various loads and using states.

According to the present invention, it becomes possible to use an encoder and a decoder having smaller circuit scale and lower power consumption.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A record reproduction apparatus that uses an error correcting code and an iterative method, comprising:
an encoding unit that divides sector data to be written into a recording medium into plural blocks and encodes each of the blocks using an LDPC code;
an iterative decoding unit that divides data read from the recording medium into the plural blocks and iteratively decodes each of the blocks divided from the read data using an LDPC decoder; and
an error correcting unit that corrects, after the iterative decoding unit iteratively decodes the sector data, an error based on a predetermined length of parity symbols, the predetermined length of parity symbols being equivalent to two times as many as a number of correctable symbol errors, wherein
the predetermined length of parity symbols is determined so that a total error correction capability with the LDPC code is equal or more than a total error correction capability in the case that the sector data is not divided before encoded using the LDPC code.

2. The record reproduction apparatus according to claim 1, further comprising:
an RLL encoding unit that performs RLL encoding, before the encoding unit divides the sector data, to constrain a continuation of 0 to a constant length or below; and
an RLL decoding unit that decodes the RLL code after the iterative decoding unit iteratively decodes the sector data.

3. The record reproduction apparatus according to claim 1, further comprising:
an MTR encoding unit that performs MTR encoding, before the encoding unit divides the sector data, to constrain a continuation of 0 and 1 to a constant length or below;
a guard bit insertion unit that inserts a guard bit such that a parity bit generated by the encoding unit satisfies the constraint; and
an MTR decoding unit that decodes the MTR code after the iterative decoding unit iteratively decodes the sector data, wherein
the iterative decoding unit iteratively decodes the sector data by repeating a removal of a guard bit, an LDPC decoding, and an insertion of a guard bit.

4. The record reproduction apparatus according to claim 1, wherein
the encoding unit encodes the sector data using an RSC code,
the iterative decoding unit iteratively decodes the sector data using an RSC code, and
the error correcting unit sets a length of a random interleaver equal to a code length of a block after the encoding unit divides the data into blocks.

5. The record reproduction apparatus according to claim 1, wherein the predetermined number is at least two or more.

6. A record reproduction method of using an error correcting code and an iterative method, comprising:
dividing sector data to be written into a recording medium into plural blocks;
encoding each of the blocks using an LDPC code;
dividing data read from the recording medium into the plural blocks;
iteratively decoding each blocks using an LDPC decoder; and
correcting, after the iteratively decoding the sector data, an error based on a predetermined length of parity symbols, the predetermined length of parity symbols being equivalent to two times as many as a number of correctable symbol errors, wherein
the predetermined length of parity symbols is determined so that a total error correction capability with the LDPC code is equal or more than a total error correction capability in the case that the sector data is not divided before encoded using the LDPC code.

7. The record reproduction method according to claim 6, further comprising:

executing RLL encoding, before the encoding, to constrain a continuation of 0 to a constant length or below; and decoding the RLL code after the iteratively decoding.

8. The record reproduction method according to claim 6, further comprising:

executing MTR encoding, before the encoding, to constrain a continuation of 0 and 1 to a constant length or below;

inserting a guard bit such that a parity bit generated at the encoding satisfies the constraint; and executing MTR decoding, after the iteratively decoding, to the MTR code, wherein the iteratively decoding is executed by repeating a removal of a guard bit, an LDPC decoding, and an insertion of a guard bit.

9. The record reproduction method according to claim 6, wherein the encoding includes encoding the sector data using an RSC code the iteratively decoding in iteration includes iteratively decoding the sector data using an RSC code, and the correcting includes setting a length of random interleaving equal to a code length of a block after the encoding.

10. The record reproduction method according to claim 6, wherein the predetermined number is at least two or more.

11. A record reproduction circuit that uses an error correcting code and an iterative method, comprising:

an encoding unit that divides sector data to be written into a recording medium into plural blocks and encodes each of the blocks using an LDPC code;

an iterative decoding unit that divides data read from the recording medium into the plural blocks and iteratively decodes each of the blocks using an LDPC decoder; and an error correcting unit that corrects, after the iterative decoding unit iteratively decodes the sector data, an error based on a predetermined length of parity symbols, the predetermined length of parity symbols being equivalent to two times as many as a number of correctable symbol errors, wherein the predetermined length of parity symbols is determined so that a total error correction capability with the LDPC code is equal or more than a total error correction capability in the case that the sector data is not divided before encoded using the LDPC code.

* * * * *